United States Patent [19]

Dietrich et al.

[11] Patent Number: 4,761,788
[45] Date of Patent: Aug. 2, 1988

[54] STRIPLINE MOUNT FOR SEMICONDUCTOR LASERS

[75] Inventors: Norman R. Dietrich, Allentown; Walter R. Holbrook, Reading; Anderson F. Johnson, Jr., Sinking Spring, all of Pa.; Alfred Zacharias, Plainfield, N.J.

[73] Assignees: American Telephone and Telegraph Company, Murray Hill; AT&T Bell Laboratories, Berkeley Heights, both of N.J.; AT&T Technologies, N.Y.

[21] Appl. No.: 792,055

[22] Filed: Oct. 28, 1985

[51] Int. Cl.$^4$ .............................................. H01S 3/096
[52] U.S. Cl. ...................................... 372/36; 357/17; 357/81; 372/38; 372/44
[58] Field of Search ............... 357/19, 17, 81; 372/36, 372/44, 50, 38; 333/33

[56] References Cited

U.S. PATENT DOCUMENTS

| | | | |
|---|---|---|---|
| 3,757,259 | 9/1973 | Jones et al. | 333/84 |
| 4,023,198 | 5/1977 | Malone et al. | 357/81 |
| 4,035,748 | 7/1977 | Kusaka et al. | 333/33 |
| 4,097,891 | 6/1978 | Selway et al. | 357/81 |
| 4,297,653 | 10/1981 | Scifres et al. | 372/50 |
| 4,301,429 | 11/1981 | Goldman et al. | 333/22 R |
| 4,338,577 | 7/1982 | Sato et al. | 372/36 |
| 4,351,051 | 9/1982 | vanAlem et al. | 372/36 |

FOREIGN PATENT DOCUMENTS 3330434 3/1985 Fed. Rep. of Germany ........ 372/36

Primary Examiner—James W. Davie
Attorney, Agent, or Firm—Wendy W. Koba

[57] ABSTRACT

A semiconductor laser mount is disclosed for use in high frequency (>500 Mb/s) applications. The mount comprises a stripline transmission path and resistive element formed in series with the optical device. Since the current sources used to modulate optical devices at these bit rates have a large impedance relative to that of the optical devices, the stripline is used as an impedance controlling network to provide frequency independent coupling from the signal source to the device and the resistive element is used to compensate the variation of the impedance of the device to essentially match that of the stripline. Since the impedance of individual optical devices may vary, the resistive element is sized to provide optimum matching. Both the stripline and resistive element are integrated with the mount material to form a monolithic structure. Additionally, low frequency optical device inputs may be formed on an isolated portion of the mount to increase the versatility of the arrangement by increasing the operable bandwidth of the optical device.

22 Claims, 2 Drawing Sheets

STRIPLINE MOUNT FOR SEMICONDUCTOR LASERS

BACKGROUND OF THE INVENTION

1. Field of the Invention

The present invention relates to a stripline mount for semiconductor lasers and, more particularly, to a stripline mount for high frequency applications which is capable of compensating the impedance of a semiconductor laser to provide improved impedance control between the laser and a high frequency modulation current source.

2. Description of the Prior Art

Semiconductor laser devices are used in a wide variety of applications due to their compactness, relatively high efficiency, and well-controlled output. However, a number of requirements are imposed upon these semiconductor laser devices. For durability, cooling of the laser element is necessary, since prolonged high temperature operation of such a laser can seriously damage and even destroy the device. Further, since the output light intensity from a laser is a function of the junction temperature of the device, the supporting structure of the laser must be able to absorb the tremendous amount of heat generated by a laser in its operating state. There exist many arrangements in the prior art for solving these problems, related to the inclusion of a thermoelectric cooler (TEC) as part of the mounting structure of the laser. U.S. Pat. No. 4,338,577 discloses one such exemplary arrangement. While it is relatively simple to solve these temperature related problems, other problems develop when the laser is operated at extremely high bit rates, for example, in the range of 500 Mb/s and above. At these speeds, the low impedance of the laser relative to that of the signal source and the parasitics associated with the interconnecting network become critical factors. Minimizing these parasitics and matching the impedance of the interconnecting network to the laser impedance over a broad bandwidth must be performed in order to achieve acceptable performance. It is well known that semiconductor lasers exhibit an impedance in the range of 5-8 ohms, while most high frequency modulation current sources, used in typical high bit rate laser transmitters, have a very high output impedance. Without control, this mismatch would cause a strongly frequency dependent coupling from the input signal source to the laser. Severe waveform distortion would result from multiple signal reflections. Additionally, since every laser will exhibit a slightly different impedance, an empirical solution to this problem is inadequate. Therefore, a need remains in the prior art for an arrangement which allows a laser diode to be connected to a high frequency input signal, and preferably, allows the laser to be coupled uniformly to the signal source over a wide bandwith.

SUMMARY OF THE INVENTION

The problem remaining in the prior art has been solved in accordance with the present invention, which relates to a stripline mount for semiconductor lasers and, more particularly, to a stripline mount for high frequency applications which is capable of compensating the impedance of a laser diode to provide improved impedance control between the laser and an external high frequency modulation current source.

It is an aspect of the present invention to provide a stripline with a mounted resistance feature located close to the laser, where the value of the resistance feature is chosen such that the combination of this resistance with that of the laser will match the characteristic impedance of the stripline. This provides a frequency independent load impedance for the modulation current source, thus facilitating uniform coupling over a wide frequency bandwidth. The value of the load impedance may be chosen to be substantially lower than the source impedance, thus limiting the necessary voltage output requirement on the current modulation source.

Another aspect of the present invention is the ability to provide resistances of various values for use with lasers exhibiting different impedances so that the stripline mounted laser will exhibit a common combined impedance, regardless of the laser's individual impedance value.

A further aspect of the present invention is to provide a high frequency connection between a signal source and the laser. Conventional electrical connections used in the prior art are replaced in the present invention with a stripline input transmission line to provide this high frequency signal path.

Yet another aspect of the present invention is to provide an alternative connector for receiving low frequency input signals, which does not use the stripline, so as to provide an arrangement equally applicable to low frequency or high frequency applications.

An additional aspect of the present invention is to include a backface monitor on the stripline mount which uses a 45 degree reflective groove to reflect the laser's backface illumination onto a planar mounted monitoring device.

Other and further aspects of the present invention will become apparent during the course of the following discussion and by reference to the accompanying drawings.

BRIEF DESCRIPTION OF THE DRAWINGS

Referring now to the drawings where like numerals represent like parts in several views.

DETAILED DESCRIPTION

Figure 1:
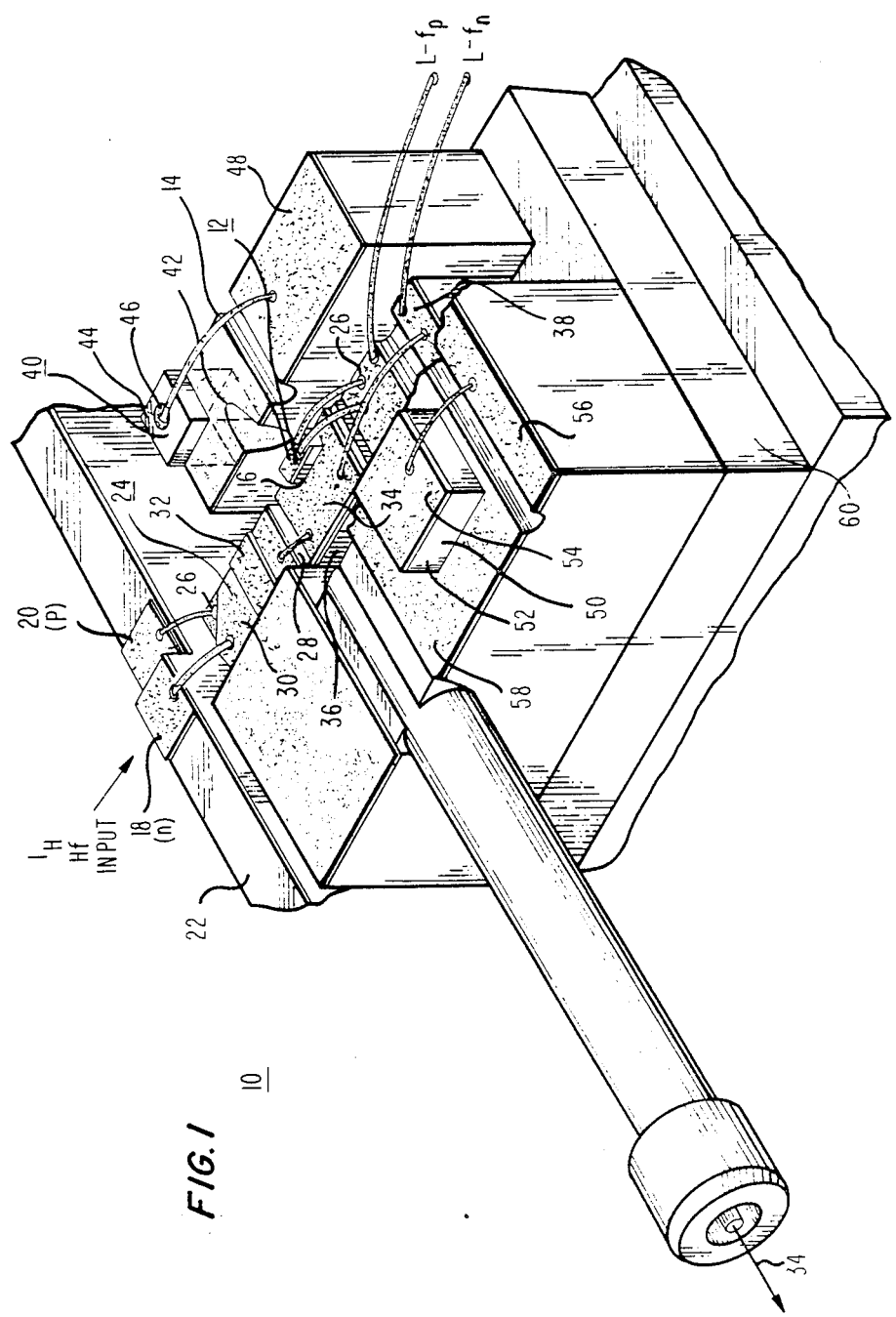
FIG. 1 is a view in perspective of a stripline mount for semiconductors lasers formed in accordance with the present invention.

A high frequency laser diode mount 10 formed in accordance with the present invention is illustrated in FIG. 1. An exemplary laser 12 is illustrated in FIG. 1 as a double heterostructure junction laser including a p-contact surface 14 and an n-contact surface 16. Throughout the course of the present discussion, reference will be made to "contact regions/layers" and "wirebonds". These "contact regions/layers" are defined as metal layers, which may comprise any suitable material well known in the art, for example, aluminum. The wirebonds may be formed with any conventional wirebonding material, where gold is commonly used for this purpose. In accordance with the present invention, laser 12 receives a high frequency input signal $I_H$ via a stripline input connection. This stripline input includes a first metal contact 18 and a second metal contact 20, separated by a dielectric material 22. As shown in FIG.

1, dielectric material 22 may comprise the external package material, if this material exhibits the required insulating properties. One such package is disclosed in detail in our copending application Ser. No. 792,056, filed concurrently with the present application and now abandoned. For the purposes of the present explanation, first metal contact 18 will be referred to as an n-contact and second metal contact 20 will be referred to as a p-contact. It is obvious, however, that the polarities of these two connections could be reversed.

Referring to FIG. 1, n-contact 18 and p-contact 20 are connected to laser 12 via a stripline 24 included on the mounting surface with laser 12. Stripline 24 includes a p-contact surface layer 26, a dielectric layer 28 disposed over a portion of p-contact layer 26, and an n-contact layer 30 disposed over dielectric layer 28. As shown in FIG. 1, p-contact 20 is wire bonded to p-contact surface layer 26 and n-contact 18 is wired bonded to n-contact layer 30. Although illustrated as a single wire bond, in actual practice a number of parallel wirebonds may be used. By using multiple wirebonds, the parasitic inductance of each separate bond, added in parallel, result in a lower overall parasitic impedance, an important factor in improving high frequency performance. This technique is applicable to all of the illustrated wirebonds. Layer 32 comprises a resistive element of the present invention which is sized to provide the necessary impedance matching between laser 12 and stripline 24, as explained in detail hereinafter. In particular, resistive element 32 may comprise a conventional film (thin or thick) resistor deposit used to provide a resistive element in integrated circuits. For example, a thin film tantalum resistor may be used to form layer 32. Referring to FIG. 1, stripline 24 is connected to laser 12 through a laser mounting structure (also referred to as a submount) including an n-contact mounting layer 34 and p-contact surface layer 26, where n-contact mounting layer 34 is separated from p-contact surface layer 26 by a dielectric layer 36. N-side 16 of laser 12 is directly bonded (for example, indium bonded) to n-contact mounting layer 34 to complete the negative polarity electrical connection. As shown in FIG. 1, p-side 14 of laser 12 is wire bonded to p-contact surface layer 26 to complete the positive polarity connection.

An aspect of the present invention is that mount 10 also provides for the connection of low frequency (less than 500 Mb/S) input signals to laser 12, where this input does not require using stripline 24 and is, in fact, electrically isolated from stripline 24. Referring to FIG. 1, contact may be made directly to p-side 14 of laser 12 via a wire bond connection, denoted l-$f_p$, between input signal source (not shown). To complete the connection, an additional n-contact region 38 is included in mount 10, wherein region 38 is wired bonded to n-contact mounting layer 36. Like the p-side contact, n-contact region 38 may be wire bonded by a connection denoted l-$f_n$ to the external signal source. During high frequency operation, a dc bias signal may be connected via wire bond l-fn to n-contact region 38, through n-contact mounting layer 34 and layer 36 to the power supply (not shown).

When activated, the main output light beam from laser 12 travels the path indicated in FIG. 1. In order to maintain a constant output signal from laser 12, a feedback monitoring arrangement may be used. One such exemplary arrangement is illustrated in FIG. 1. A PIN photodiode 40 is used as a monitoring element and is located behind laser 12 in the manner illustrated in FIG. 1. Since laser 12 will emit light in both directions, it is not necessary for the monitoring arrangement to be directly in the path of the output signal. A reflective groove 42 comprising an angle of, for example, 45°, is included in the portion of mount 10 holding PIN photodiode 40 so that the backface light from laser 12 may be redirected into the front major surface of n-layer 44 of PIN photodiode 40. Utilizing this reflective groove structure allows PIN photodiode 40 to be attached to mount 10 along a major surface area as shown, providing a much more rugged contact than if the major surface of n-layer 40 had to be positioned directly in the light beam path of the backface of laser 12. P-contact 46 of PIN photodiode 40 is wirebonded to a p-contact mount 48, for subsequent connection to an external monitor (not shown), where this external monitor, in response to the output signal from PIN photodiode 40, is used to control the operation of the input source.

It is well known in the art that the output intensity from a laser is a function of the device's junction temperature. Therefore, it is usually desirable to be able to monitor the ambient temperature as close to the laser as possible. To this end, a temperature sensor 50, for example a thermistor, may also be formed on mount 10. Further, operation of a laser may cause the internal package temperature to rise to unacceptable levels, if not controlled. Therefore, laser mounts may include a thermoelectric cooler as an integral part of the mount. One such cooler 60 is illustrated as the base of mount 10.

Figure 2:
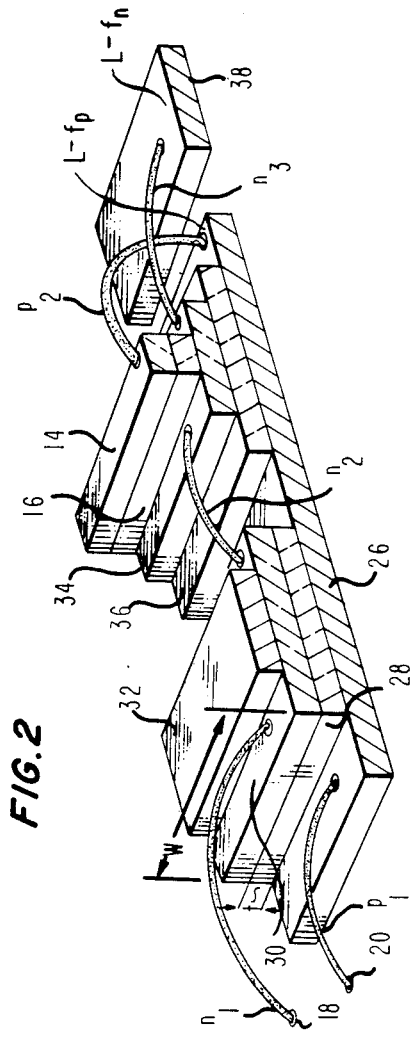
FIG. 2 is a cut-away illustration of the embodiment illustrated in FIG. 1.

A clearer view of the interconnection of stripline 24 to laser 12 is illustrated in cut-away form in FIG. 2. As shown, n-contact 18 is connected to n-contact layer 30 by a wirebond denoted $n_1$ (where as discussed above, a multiple wirebond would be used in practice). Similarly, p-contact 20 is connected to p-contact surface layer 26 by a wirebond $p_1$. As can be seen by reference to FIG. 2, p-contact surface layer 26 extends fully under the portion of the mount supporting laser 12. In order to form stripline 24, as discussed above, a dielectric layer 28 is positioned between contact layers 26 and 30, so as to form a three-level parallel-plate stripline structure. It is well understood that the characteristic impedance $Z_o$ of stripline 24 is a function of the thickness t, width w, and dielectric constant $\epsilon$ of dielectric layer 28. In forming the stripline to comprise the given impedance $Z_o$, the value for $\epsilon$ is defined by the material and the necessary thickness t and width w are determined by standard methods well known in the art.

From many studies, it has been found that a laser diode capable of operating above 500 Mb/S has an impedance in the range of 5–8 ohm. Most input signal supply sources, conventionally current sources, capable of generating these high frequency signals have a high output impedance Z. In order to provide frequency independent coupling and minimize waveform distortion, therefore, an impedance controlling network must be used. It would appear that the ideal solution would be either to decrease the impedance looking back from the laser to the source, or vice versa, to increase the resistance the supply sees. For many reasons, however, these alternatives are impractical, if not impossible. In particular, decrease to 5Ω would require the use of an extremely thin dielectric layer in stripline 24 (making the device too fragile for practical applications). Working at a high impedance would greatly increase the necessary voltage swing of the modulating current source to deliver the same current. Accordingly, impedances in the range between these two values have been found to be a satisfactory compromise. Therefore, since the source impedance will not be matched to that of the interconnecting transmission line, it is essential that the best possible impedance match be achieved between the transmission line and the laser to avoid multiple signal reflections and the resulting waveform distortions.

In accordance with the present invention, frequency independent coupling and minimum waveform distortion will occur when the device's impedance is matched as closely as possible to that of stripline 24, where for the purposes of the present discussion, this value will be denoted as $Z_o$. Since the impedance of a laser diode is known to vary between 5 and 8 ohms, a means of compensating this variation is required. Therefore, resistor 32 is included in stripline 24 to control the resistance seen looking from the high frequency modulation current source into laser 12. The inclusion of resistor 32 not only serves to increase this internal resistance, but also provides a means of providing an impedance between the current source and laser 12 which is independent of the actual impedance of the laser used. That is, after a particular laser is mounted, its impedance can be measured and the required additional resistance added. For example, a given laser exhibits an impedance of 6.25 ohms. A resistor 32 of value Z-6.25 ohms may then be formed on stripline 24 to provide the desired value of Z ohms. Likewise, if a laser exhibited an internal resistance of 8 ohms, a resistor 32 of Z-8 ohms would be formed on stripline 32. This ability to control the input resistance is an important aspect of the present invention.

As previously described, stripline 24 is connected to laser 12 using a pair of (multiple) wirebonds. In particular, p-side 14 of laser 12 is connected by a wirebond $p_2$ to p-contact surface layer 26. N-side 16 of laser 12 is directly soldered to n-contact mounting surface 34, where mounting surface 34 is connected by a wirebond $n_2$ to n-contact layer 32. The alternative low-frequency connections l-$f_p$ and l-$f_n$ are connected as shown in FIG. 2, where a third wirebond $n_3$ is used to connect n-contact mounting surface 34 to n-contact region 38. As stated above, this third connection allows for the dc bias potential to be connected through the various n-contact layers back to the high frequency signal source. As shown in FIG. 2, n-contact mounting surface 34 is separated from p-contact surface layer 26 by a dielectric surface layer 36. Layer 36 functions not only to keep the p-contact away from the n-contact, but also allows the combination of layers 26, 34 and 36 to form another stripline, thus allowing the stripline transmission quality of the input signal to be passed directly to the laser. In fact, by wirebonding p-side 14 to layer 26, it can be imagined that the stripline actually continues and surrounds laser 12, contacting p-side 14. Additionally, surface layer 36 comprises a material which is capable of absorbing the heat generated by laser 12 and passing this heat along to TEC 60. Beryllia is one such material that may be used to form layer 36. In fact, it would be possible to utilize one continuous layer of dielectric material to form both layers 28 and 36. This would result in eliminating wirebond $n_2$ and thus reducing the parasitic inductance of the structure. However, since beryllia, or any alternative heat-sinking material, must be used under laser 12, is more expensive than the common dielectrics, for example, alumina, which may be used for layer 28. Further, since the dielectric constant of beryllia is less than that of alumina, a much thinner layer of beryllia would be required to provide the characteristic impedance of $Z_o$ ohms. For all of these reasons, therefore, the preferred embodiment of the present invention utilizes two separate structures for stripline 24 and the submount of laser 12.

Figure 3:
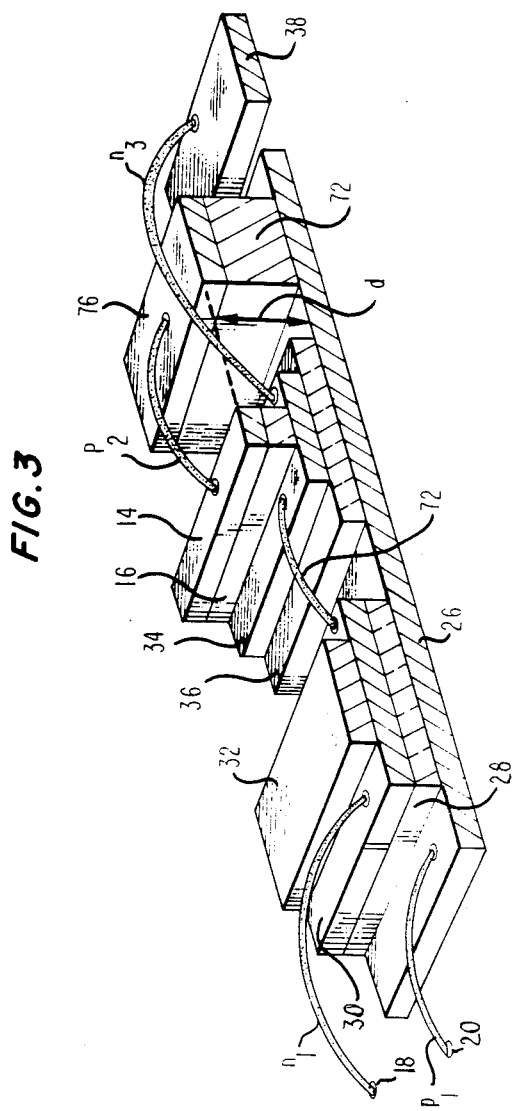
FIG. 3 is a cut-away illustration of an alternative embodiment of the present invention especially suited for extremely high frequency applications.

For extremely high bit rate (for example, greater than 5 Gb/s), it may be required to shorten the length of wirebond $p_2$ (even though, as stated above this may be a multiple wirebond arrangement). This may be accomplished by using an alternative embodiment of the present invention, illustrated by a cut-away view in FIG. 3. As shown, an additional p-contact mount 72 is included to raise the level of wirebond $p_2$ to coincide with the level of p-side 14 of laser 12, where this level is indicated as d in FIG. 3. For example, mount 72 may include a metal spacer element 74 (which may be aluminum that is soldered directly to p-contact surface layer 26 to provide electrical connection. A top surface contact layer 76 is soldered to spacer 74 and wirebond $p_2$ is attached between p-side 14 of laser 12 and elevated p-contact 76.

What is claimed is:

1. An optical transmission system including
a semiconductor optical device having a predetermined characteristic impedance Z;
mounting apparatus for said semiconductor optical device, said mounting apparatus comprising
a stripline transmission path of a predetermined characteristic impedance $Z_o$ for connection to a high frequency signal source; and
resistive means connected in series between said stripline transmission path and said semiconductor optical device, said resistive means having a predetermined resistance value such that the combination of said predetermined resistance and said semiconductor optical device characteristic impedance is substantially equal to said stripline transmission path characteristic impedance.

2. An optical transmission system as defined in claim 1 wherein the stripline transmission path comprises
a first conductive layer;
an insulating layer disposed over and in contact with said first conductive layer, said insulating layer being of a predetermined thickness t and a predetermined width w, and having a predetermined dielectric constant $\epsilon$, where said predetermined thickness width and dielectric constant determine the characteristic impedance of said stripline transmission path; and
a second conductive layer disposed over and in contact with said insulating layer.

3. An optical transmission system as defined in claim 2 wherein the insulating layer comprises alumina (Al$_2$O$_3$) having a predetermined dielectric constant in the range of 9 to 9.5.

4. An optical transmission system as defined in claim 2 wherein
the first conductive layer is for connection to a negative polarity output signal from the high frequency signal source; and
the second conductive layer is for connection to a positive polarity output signal from said high frequency signal source.

5. An optical transmission system as defined in claim 2 wherein the resistance means comprises a film resistor deposit disposed over and in contact with a portion of the second conductive layer of the stripline transmission path.

6. An optical transmission system as defined in claim 5 wherein the film resistor deposit comprises a thin film resistor deposit.

7. An optical transmission system as defined in claim 5 wherein the film resistor deposit comprises a thick film resistor deposit.

8. An optical transmission system as defined in claim 5 for use with a semiconductor optical device having an impedance Z in the range of 5 to 8 ohms, the film resistor deposit being formed to have a resistance value in the range of $Z_o$-5 to $Z_o$-8 ohms such that the combination of said resistance with said semiconductor optical device is essentially $Z_o$ ohms.

9. An optical transmission system as defined in claim 2, wherein the mounting apparatus further comprises a semiconductor optical submount structure including
   an insulating layer disposed over and in contact with the first conductive layer of the stripline transmission path; and
   a conductive layer disposed over and in contact with said submount insulating layer, wherein said semiconductor optical device is electrically connected between said submount conductive layer and said stripline transmission path first conductive layer.

10. An optical transmission system as defined in claim 9 wherein the stripline transmission path is for connection to a positive polarity input signal and the submount conductive layer is for connection to a negative polarity input signal.

11. An optical transmission system as defined in claim 10 wherein the submount insulating layer is a portion of the stripline transmission path insulating layer and the submount conductive layer is a portion of the stripline transmission path second conductive layer.

12. An optical transmission system as defined in claim 11 wherein the submount insulating layer comprises a layer of beryllia (BeO).

13. An optical transmission system as defined in claim 2 wherein said mounting apparatus further comprises
   a conductive spacer block of a predetermined height d disposed over and in contact with the stripline transmission path first conductive layer for providing electrical connection between said first conductive layer and the semiconductor optical device.

14. An optical transmission system as defined in claim 13 wherein the spacer block comprises aluminum.

15. An optical transmission system as defined in claim 1 wherein the mounting apparatus further comprises low frequency input connection means electrically isolated from the stripline transmission path.

16. An arrangement for coupling a semiconductor optical device to a signal source, said arrangement comprising
   a stripline transmission path having a predetermined characteristic impedance $Z_o$; and
   resistance means connected in series with said stripline transmission path, chosen to provide impedance matching between said stripline transmission path and an associated semiconductor optical device.

17. A coupling arrangement as defined in claim 16 wherein the stripline transmission path comprises
   a first conductive layer;
   an insulating layer disposed over and in contact with said first conductive layer, said insulating layer being of a predetermined thickness t and a predetermined width w, and having a predetermined dielectric constant $\epsilon$, where said predetermined thickness, width and dielectric constant determine the characteristic impedance of said stripline transmission path; and
   a second conductive layer disposed over and in contact with said insulating layer.

18. A coupling arrangement as defined in claim 17 wherein the insulating layer comprises alumina ($Al_2O_3$) having a predetermined dielectric constant in the range of 9 to 9.5.

19. A coupling arrangement as defined in claim 17 wherein the resistance means comprises a film resistor deposit disposed over and in contact with a portion of the second conductive layer of the stripline transmission path.

20. A coupling arrangement as defined in claim 19 wherein the film resistor deposit comprises a thin film resistor deposit.

21. A coupling arrangement as defined in claim 19 wherein the film resistor deposit comprises a thick film resistor deposit.

22. A coupling arrangement as defined in claim 17 wherein the arrangement further comprises an optical submount structure including
   an insulating layer disposed over and in contact with the first conductive layer of the stripline transmission path; and
   a conductive layer disposed over and in contact with said submount insulating layer, said conductive layer for direct connection to a semiconductor optical device.

* * * * *